United States Patent
Ban et al.

(10) Patent No.: US 7,339,501 B2
(45) Date of Patent: Mar. 4, 2008

(54) METHOD AND APPARATUS FOR RECOGNITION AND TAGGING OF MULTIPLE LAYERED ENTROPY CODING SYSTEM

(75) Inventors: Oliver K. Ban, Austin, TX (US); William Bornstein, Stormville, NY (US); Marie Meliksetian, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 11/390,533

(22) Filed: Mar. 28, 2006

(65) Prior Publication Data

US 2007/0229343 A1    Oct. 4, 2007

(51) Int. Cl.
    *H03M 7/34* (2006.01)
(52) U.S. Cl. .......................... 341/51; 341/106
(58) Field of Classification Search .................. 341/50, 341/65, 106, 67, 51, 59, 63
    See application file for complete search history.

(56) References Cited

U.S. PATENT DOCUMENTS

| | | | |
|---|---|---|---|
| 6,633,242 B2 * | 10/2003 | Brown | 341/50 |
| 6,765,510 B2 * | 7/2004 | Koyama et al. | 341/51 |
| 6,987,890 B2 * | 1/2006 | Joshi et al. | 382/240 |
| 7,111,094 B1 * | 9/2006 | Liu et al. | 710/65 |

* cited by examiner

*Primary Examiner*—Brian Young
(74) *Attorney, Agent, or Firm*—Gibb & Rahman, LLC; Derek S. Jennings

(57) ABSTRACT

Embodiments herein provide a method and apparatus for recognition and tagging of multiple layered entropy coding system. The method comprises receiving a signal and performing entropy average coding to produce an entropy coded bit stream. Next, the method adds a tag to a beginning portion of the entropy coded bit stream. The tag comprises a plurality of headers, wherein each of the headers differs from one another, and wherein the headers comprise an elongated bit stream. Following this, the method reads the tag when processing the entropy coded bit stream and avoids subsequent entropy averaging on the entropy coded bit stream when the tag is present. The avoiding of the subsequent entropy averaging avoids unnecessary coding and entropy averaging of the entropy coded bit stream.

18 Claims, 6 Drawing Sheets

METHOD AND APPARATUS FOR RECOGNITION AND TAGGING OF MULTIPLE LAYERED ENTROPY CODING SYSTEM

BACKGROUND

1. Field of the Invention

Embodiments of the invention provide a method and apparatus for recognition and tagging of multiple layered entropy coding system.

2. Description of the Related Art

The point of wired and wireless communication technology and its applications are centered on "access anywhere" concept. This includes the access to data, software and services. The interface must be standard and requires software and hardware integration. Communication technology is a leading edge technology driver that involved multi-layered sophisticated technology and algorithms, from several decades of research and applications. In general, communication technologies include multiple layered source coding, channel coding, network resource access, which are all involved with both server hardware and software as well as integration technologies. Most of them are very computational intensive and involved transformation and entropy coding technologies, as illustrated in FIG. 1. More specifically, intermediate components between an audio video source and RF transmission comprise quantization 100, compression 110, cipher coding channel coding 120, domain transformation 130, source coding 140, and interleaving spreading 150. Multiplexing (MUX) 160, error correction 170, and modulation 180 are also included.

The source-coding portion 140 included voice processing, relational database access, audio and video compression, voice recognition, and particularly, VLC (Variable Length Coding) coding to gain better channel efficiency. The focus point is on the standard conforming, interoperability, and end-to-end solution. Thus combined rich history of unevenly advances of varies aspect of communication technologies, as well as un-matching growth rate of channel capacity, together have generated many different coding and modulation schemes. Those schemes that being applied to the source contents have many effects on channel capacity and the content's entropy itself.

As part of nature, the original sources contents tend to have bigger entropy value with time passed by, originated from second law of thermo dynamics. Entropy change, $\Delta S$, measures how much information energy is spread out in a channel, or how spread out is the energy of a system (either always involving temperature T or source contents): $\Delta S = q/T$. So, in that equation, q (the enthalpy of fusion) is how much energy was spread out in the channels. In terms of information theory, the entropy of an information source S is defined as:

$$H(S) = \eta = \sum_i p_i \log_2 \frac{1}{p_i}$$

Where pi is the probability that symbol Si in S will occur.

The original source contents tents to have very uneven entropy distribution, as shown in FIG. 2. Specifically, graphs 200 and 210 illustrate percentage distribution (x-axis) versus probability (y-axis). Graph 200 illustrates that without differential coding, the entropy is 6.42 bits; and, graph 210 illustrates that with differential coding, the entropy is 6.07 bits. As the statistics done to source contents can show, the frequency distribution of digits in a series, for example, can be shown to have an important influence on the randomness of the series. Just a simple inspection suggests that a series consisting entirely of either 0's or 1's is far from random, and the algorithmic approach confirms that conclusion. If such a series is n digits long, its complexity is approximately equal to the logarithm to the base 2 of n. The series can be produced by a simple algorithm such as "Print 0 n times," in which virtually all the information needed is contained in the binary numeral for n. The size of this number is about log 2 n bits. Since for even a moderately long series the logarithm of n is much smaller than n itself, such numbers are normally low complexity.

There are many nested coding algorithms added to the original source contents, both in the source coding process and channel coding process. The entropy of the contents was averaged out already during the source coding process, additional channel coding seems did not change the entropy of the source contents much. But added bit for error protection and multiple access purposes.

The problem come from multiple layered algorithms tend to repeated coding the source contents after the initially VLC coding, thus greatly reduce the intended effect of entropy coding but cause adverse effect of adding unnecessary bit to the originally entropy coded contents.

SUMMARY

Embodiments of the invention provide a method and apparatus for recognition and tagging of multiple layered entropy coding system. The method comprises receiving a signal and performing entropy average coding to produce an entropy coded bit stream. The performing of the entropy average coding comprises encoding the signal and adjusting entropy of the signal to make the entropy consistent throughout the signal. Further, the production of the entropy coded bit stream comprises producing a condensed signal by removing redundant entropy.

Next, the method adds a tag to a beginning portion of the entropy coded bit stream, between a header checker and a payload random byte and trail byte payload. The tag comprises a plurality of headers, wherein each of the headers differs from one another, and wherein the headers comprise an elongated bit stream. Following this, the method reads the tag when processing the entropy coded bit stream and avoids subsequent entropy averaging on the entropy coded bit stream when the tag is present. The avoiding of the subsequent entropy averaging avoids unnecessary coding and entropy averaging of the entropy coded bit stream.

Accordingly, by tagging the coded contents, and by make it universal recognizable, a lot of benefit can be realized. Every upper layered processing up to applications all will not apply further entropy averaging processing due to the known effect. Not only the bit rate gets reduced, but also the processing power and processing time are saved. Further, program run faster on less power and channel capacities are utilized more efficiently.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
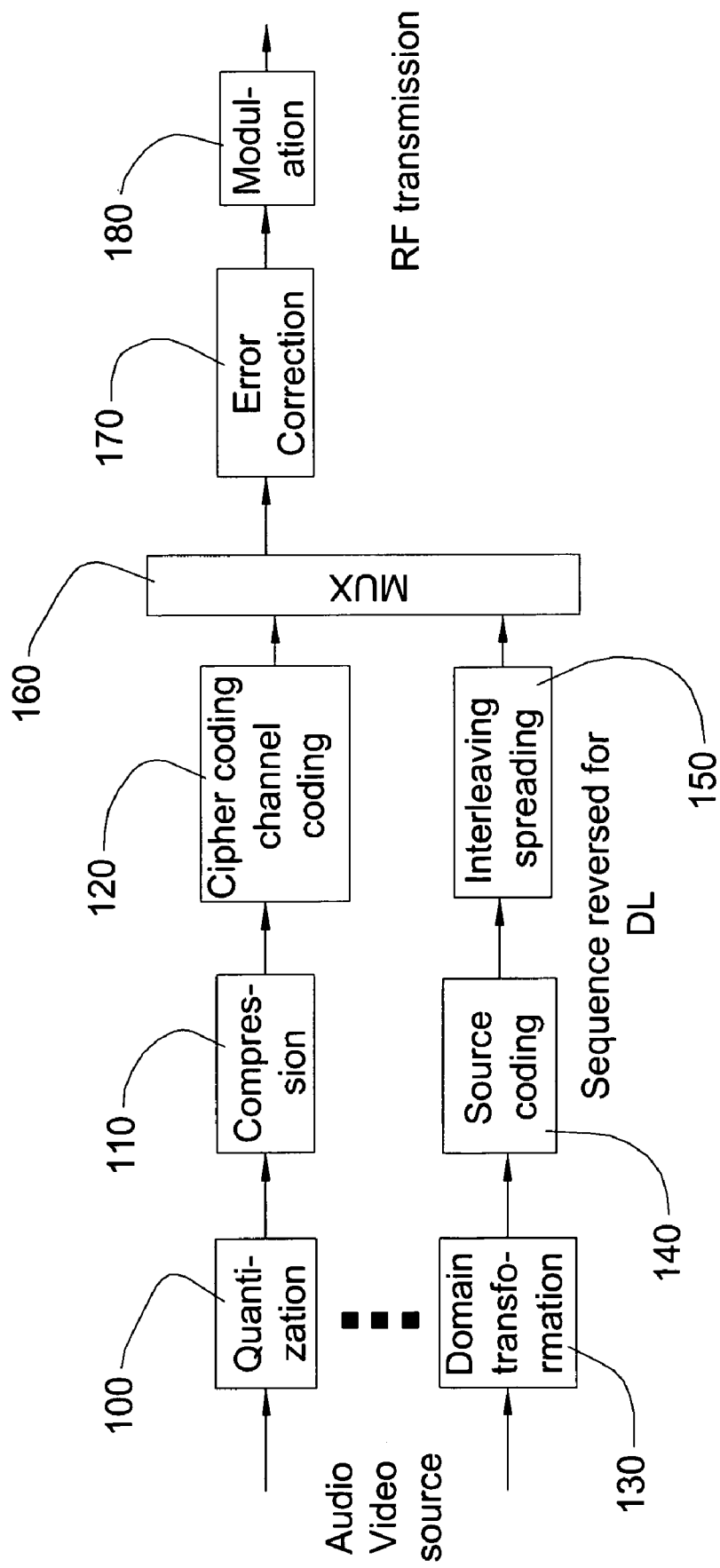
FIG. 1 is a diagram illustrating a multiple layered communication system architecture.
Figure 2:
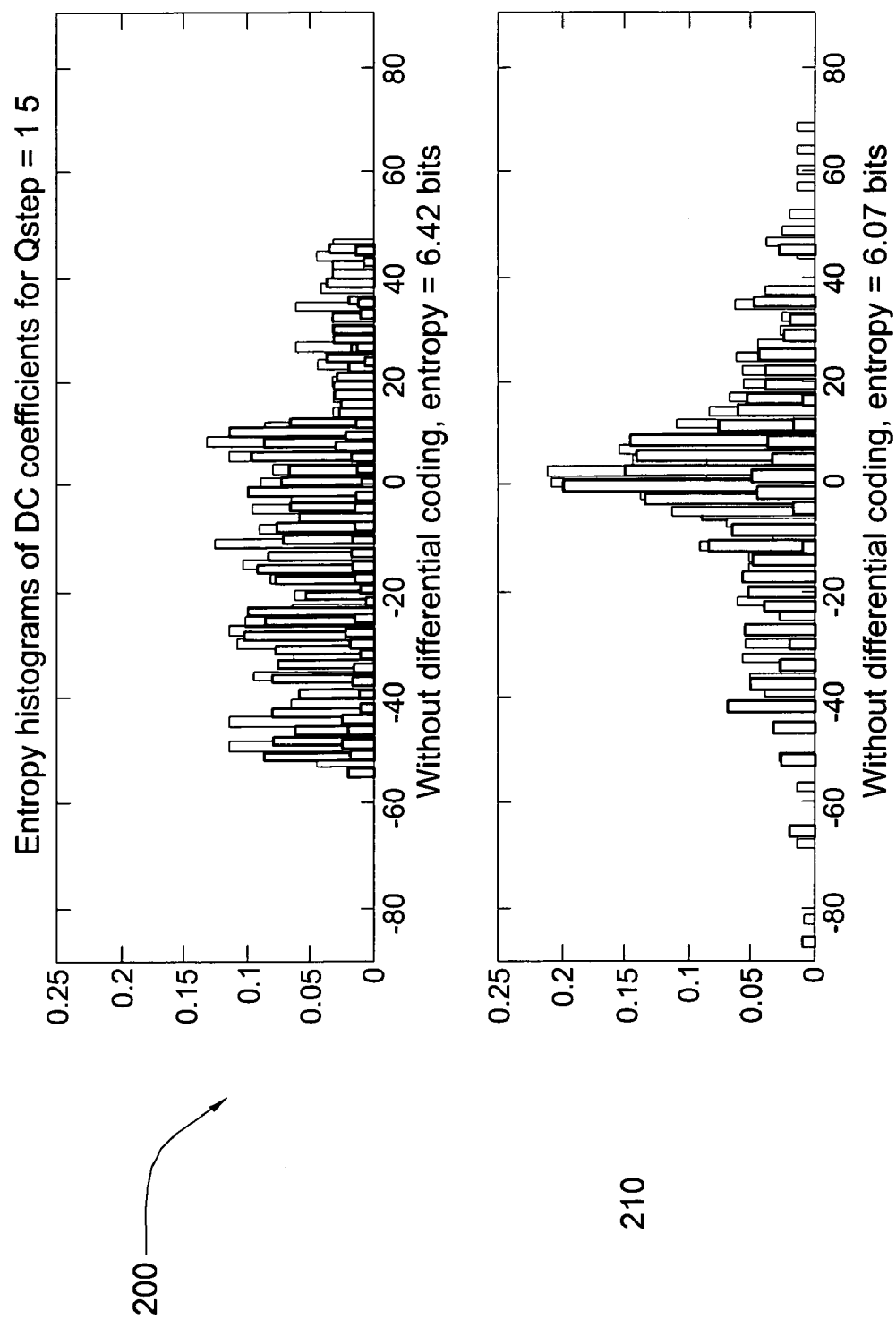
FIG. 2 are graphs illustrating an entropy distribution.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

By tagging coded contents, and by make it universal recognizable, a lot of benefit can be realized. Every upper layered processing up to applications all will not apply further entropy averaging processing due to the known effect. Not only the bit rate gets reduced, but also the processing power and processing time are saved. Further, program run faster on less power and channel capacities are utilized more efficiently.

Embodiments herein comprise an entropy coding scheme, which assigns codes to symbols so as to match code lengths with the probabilities of the symbols. Specifically, entropy encoders can be used to compress data by replacing symbols represented by equal-length codes with symbols represented by codes proportional to the negative logarithm of the probability. Therefore, the most common symbols use the shortest codes. In other words, after data has been quantized into a finite set of values, it can be encoded using an entropy coder to give additional compression. Entropy denotes the amount of information present in the data, and an entropy coder encodes the given set of symbols with the minimum number of bits required to represent them.

Figure 3:
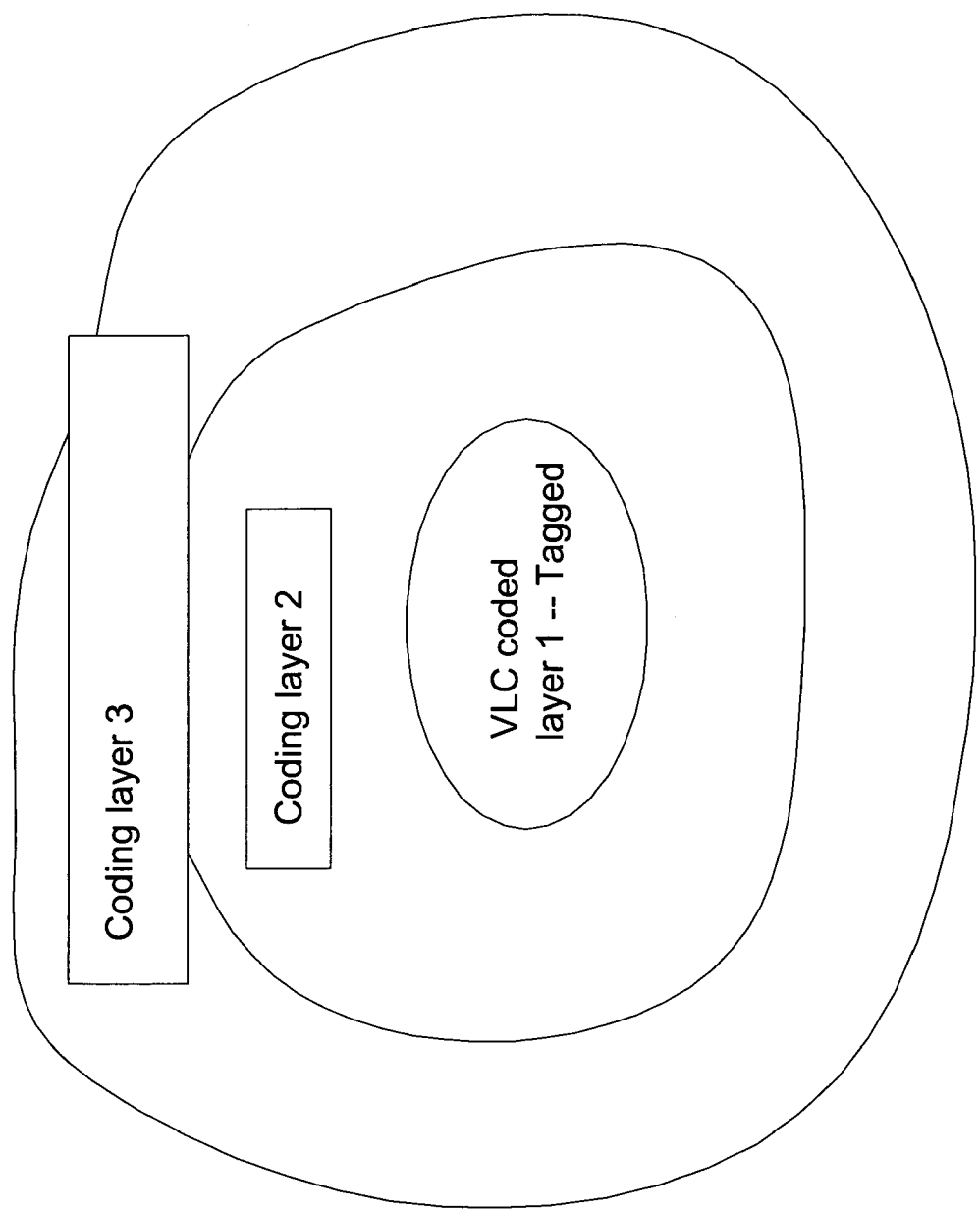
FIG. 3 is a diagram illustrating an entropy code tagging architecture.

The solution lay on the idea of making a unique and universal accepted tag to the initially entropy coded contents. Making a unique and universal accepted tag to the initially entropy coded contents will eliminate the need for the future higher layered processing and application to add further entropy coding, as shown in FIG. 3. Specifically, FIG. 3 illustrates the architecture of tagging the initially VLC coded contents (i.e., the entropy coded contents) and make the access universally acceptable. A VLC coded layer 1 is enclosed within a coding layer 2, which in turn is enclosed within a coding layer 3. The VLC coded layer 1 is also referred to as the physical layer; the coding layer 2 is also referred to as the link layer; and the coding layer 3 is also referred to as the transport layer. The tag is in the physical layer, which is accepted by the link layer or the transport layer.

Figure 4:
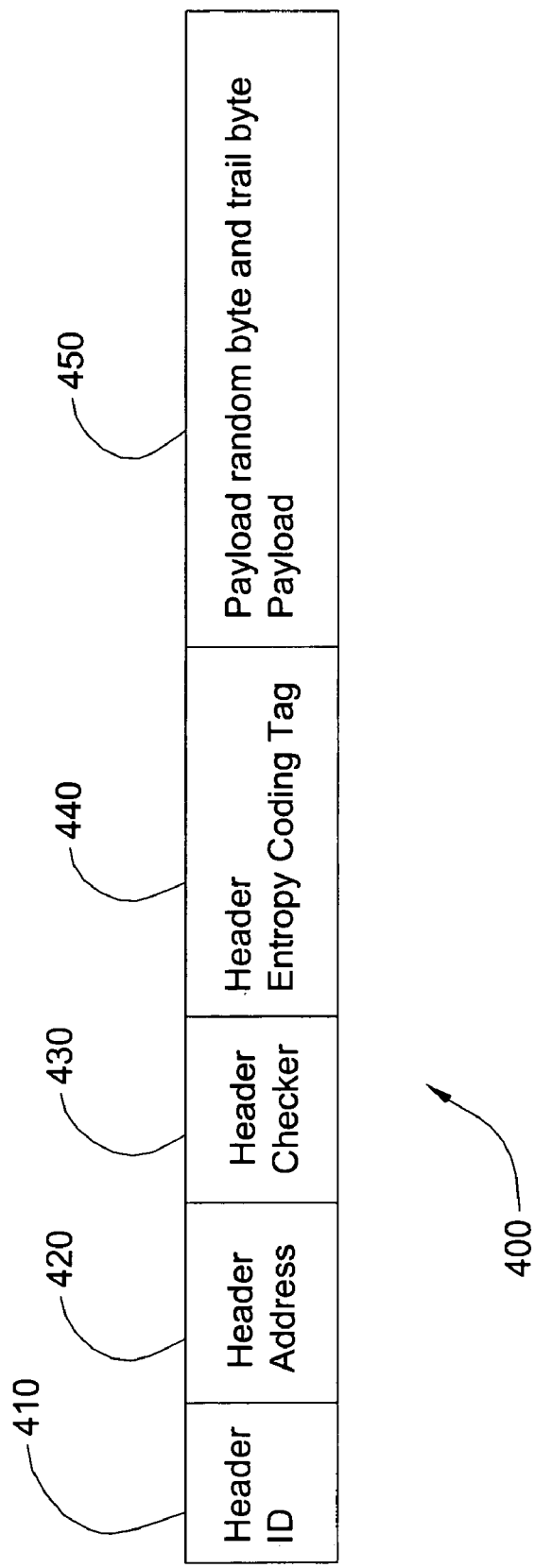
FIG. 4 is a diagram illustrating an entropy coded bit stream tagging architecture.

The implementation of the tagging mechanism can be done like shown in FIG. 4. Specifically, FIG. 4 illustrates a VLC coded bit stream 400 (also referred to herein as "entropy coded bit stream"), comprising a header ID 410, a header address 420, a header checker 430, a header entropy coding tag 440, and a payload random byte and trail byte payload 450. The header ID 410, header address 420, header checker 430, and the header entropy coding tag 440 precedes data and/or control signals and describes the file or transmission unit, such as, for example, the file or transmission unit's length and whether there are other files or transmission units logically or physically associated with it.

The universally accepted tag (i.e., the header entropy coding tag 440) is designed to be different ordinary headers but has longer bit stream, so it can not be confused with regular header bits. The entropy coded tag 440 is inserted in the beginning of the VLC coded bit stream 400, after it is done initially. The tagged packets 400 are put into channels. Whenever upper layered processing and application program see the entropy coded tag 440, they are not going to do any entropy average coding so that power and resource are saved. Specifically, because the bit stream has already been coded and the entropy has already been averaged, further coding and averaging would be wasteful and inefficient.

Thus, embodiments herein provide a method and apparatus for recognition and tagging of multiple layered entropy coding system. The method comprises receiving a signal and performing entropy average coding to produce an entropy coded bit stream. The performing of the entropy average coding comprises encoding the signal and adjusting entropy of the signal to make the entropy consistent throughout the signal. Further, the production of the entropy coded bit stream comprises producing a condensed signal by removing redundant entropy. As more fully described above, the entropy average coding assigns codes to symbols so as to match code lengths with the probabilities of the symbols. Specifically, entropy encoders can be used to compress data by replacing symbols represented by equal-length codes with symbols represented by codes proportional to the negative logarithm of the probability.

Next, the method adds a tag to a beginning portion of the entropy coded bit stream, between a header checker and a payload random byte and trail byte payload.

As described above, the tag is in the physical layer (i.e., the VLC coded layer 1), which is accepted by the link layer (i.e., the VLC coded layer 2) or the transport layer (i.e., the VLC coded layer 3). The tag comprises a plurality of headers, wherein each of the headers differs from one another, and wherein the headers comprise an elongated bit stream.

As also described above, the VLC coded bit stream 400, comprising a header ID 410, a header address 420, a header checker 430, a header entropy coding tag 440, and a payload random byte and trail byte payload 450.

Following this, the method reads the tag when processing the entropy coded bit stream and avoids subsequent entropy averaging on the entropy coded bit stream when the tag is present. As described above, making a unique and universal accepted tag to the initially entropy coded contents will eliminate the need for the future higher layered processing and application to add further entropy coding. The avoiding of the subsequent entropy averaging avoids unnecessary coding and entropy averaging of the entropy coded bit stream. Specifically, because the bit stream has already been coded and the entropy has already been averaged, further coding and averaging would be wasteful and inefficient.

Figure 5:
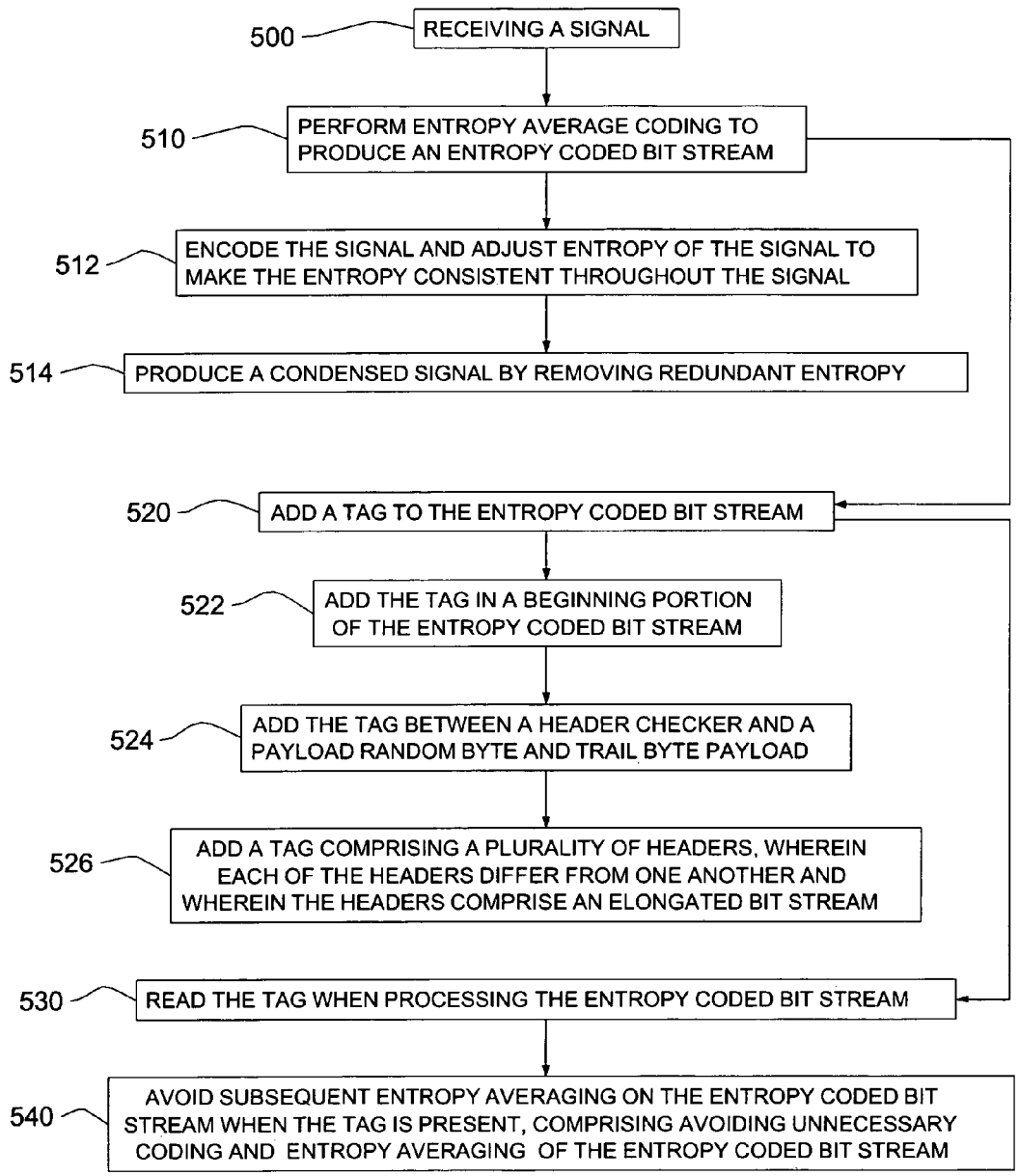
FIG. 5 is a flow diagram illustrating a method for recognition and tagging of multiple layered entropy coding system.

FIG. 5 illustrates a flow diagram of a method for recognition and tagging of multiple layered entropy coding system. The method begins by receiving a signal (item 500) and performing entropy average coding to produce an entropy coded bit stream (item 510). More specifically, this comprises encoding the signal and adjusting entropy of the signal to make the entropy consistent throughout the signal (item 512). In addition, the performing of said entropy average coding to produce the entropy coded bit stream comprises producing a condensed signal by removing redundant entropy (item 514). As described above, after data has been quantized into a finite set of values, it can be encoded using an entropy coder to give additional compression. Entropy denotes the amount of information present in the data, and an entropy coder encodes the given set of symbols with the minimum number of bits required to represent them.

Next, in item 520, a tag is added to the entropy coded bit stream. More specifically, this involves adding the tag in a beginning portion of the entropy coded bit stream (item 522), wherein the tag is added between a header checker and a payload random byte and trail byte payload (item 524). Moreover, adding the tag comprises adding a tag having a plurality of headers, wherein each of the headers differ from one another, and wherein the headers comprise an elongated bit stream (item 526). As described above, the universally accepted tag (i.e., the header entropy coding tag) is designed to be different ordinary headers but has longer bit stream, so it can not be confused with regular header bits.

Following this, in item 530, the tag is read when processing the entropy coded bit stream. The method then, in item 540, avoids subsequent entropy averaging on the entropy coded bit stream when the tag is present, wherein the avoiding of the subsequent entropy averaging comprises avoiding unnecessary coding and entropy averaging of the entropy coded bit stream. As also described above, making a unique and universal accepted tag to the initially entropy coded contents will eliminate the need for the future higher layered processing and application to add further entropy coding. Because the bit stream has already been coded and the entropy has already been averaged, further coding and averaging would be wasteful and inefficient.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
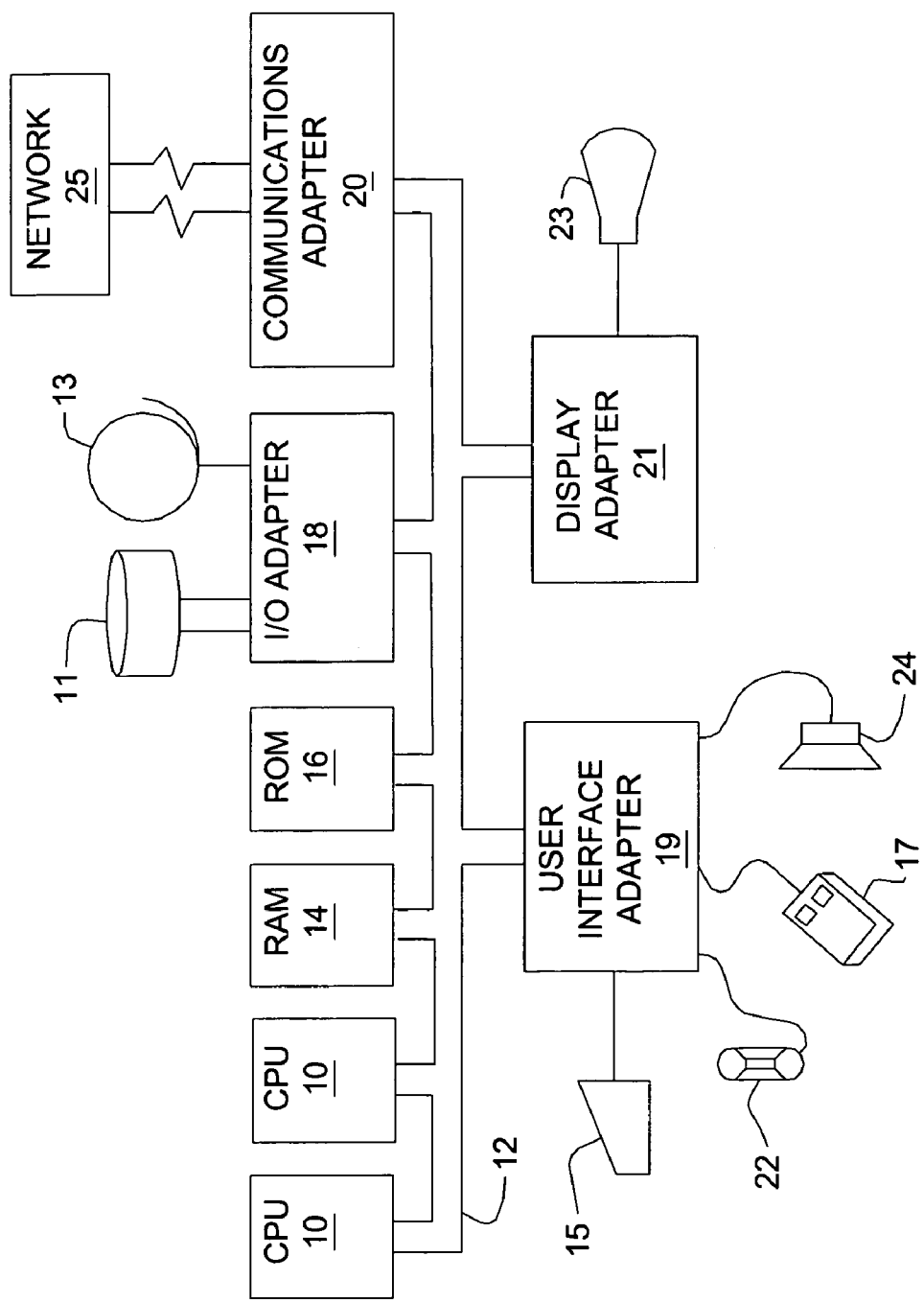
FIG. 6 is a computer system for recognition and tagging of multiple layered entropy coding system.

A representative hardware environment for practicing the embodiments of the invention is depicted in FIG. 6. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Accordingly, by tagging the coded contents, and by make it universal recognizable, a lot of benefit can be realized. Every upper layered processing up to applications all will not apply further entropy averaging processing due to the known effect. Not only the bit rate gets reduced, but also the processing power and processing time are saved. Further, program run faster on less power and channel capacities are utilized more efficiently.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method, comprising:
receiving a signal;
performing entropy average coding to produce an entropy coded bit stream;
adding a tag to said entropy coded bit stream;
reading said tag when processing said entropy coded bit stream; and
avoiding subsequent entropy averaging on said entropy coded bit stream when said tag is present.

2. A method, comprising:
receiving a signal;
performing entropy average coding to produce an entropy coded bit stream, wherein said performing of said entropy average coding comprises encoding said signal and adjusting entropy of said signal to make said entropy consistent throughout said signal;
adding a tag to said entropy coded bit stream;
reading said tag when processing said entropy coded bit stream; and avoiding subsequent entropy averaging on said entropy coded bit stream when said tag is present.

3. The method according to claim 1, all the limitations of which are incorporated herein by reference, wherein said avoiding of said subsequent entropy averaging comprises avoiding unnecessary coding and entropy averaging of said entropy coded bit stream.

4. A method, comprising:
receiving a signal;
performing entropy average coding to produce an entropy coded bit stream, wherein said performing of said entropy average coding to produce said entropy coded bit stream comprises producing a condensed signal by removing redundant entropy;
adding a tag to said entropy coded bit stream;
reading said tag when processing said entropy coded bit stream; and avoiding subsequent entropy averaging on said entropy coded bit stream when said tag is present.

5. The method according to claim 1, all the limitations of which are incorporated herein by reference, wherein said adding of said tag comprises adding said tag in a beginning portion of said entropy coded bit stream.

6. A method, comprising:
receiving a signal;
performing entropy average coding to produce an entropy coded bit stream;
adding a tag to said entropy coded bit stream, wherein said adding of said tag comprises adding said tag between a header checker and a payload random byte and trail byte payload;
reading said tag when processing said entropy coded bit stream; and avoiding subsequent entropy averaging on said entropy coded bit stream when said tag is present.

7. A method, comprising:
receiving a signal;
performing entropy average coding to produce an entropy coded bit stream;
adding a tag to said entropy coded bit stream, wherein said adding of said tag comprises adding a tag comprising a plurality of headers, wherein each of said headers differ from one another, and wherein said headers comprise an elongated bit stream;
reading said tag when processing said entropy coded bit stream; and avoiding subsequent entropy averaging on said entropy coded bit stream when said tag is present.

8. A method, comprising:
receiving a signal;
performing entropy average coding to produce an entropy coded bit stream, wherein said performing of said entropy average coding comprises encoding said signal and adjusting entropy of said signal to make said entropy consistent throughout said signal;
adding a tag to said entropy coded bit stream;
reading said tag when processing said entropy coded bit stream; and
avoiding subsequent entropy averaging on said entropy coded bit stream when said tag is present, wherein said avoiding of said subsequent entropy averaging comprises avoiding unnecessary coding and entropy averaging of said entropy coded bit stream.

9. The method according to claim 8, all the limitations of which are incorporated herein by reference, wherein said performing of said entropy average coding to produce said entropy coded bit stream comprises producing a condensed signal by removing redundant entropy.

10. The method according to claim 8, all the limitations of which are incorporated herein by reference, wherein said adding of said tag comprises adding said tag in a beginning portion of said entropy coded bit stream.

11. The method according to claim 8, all the limitations of which are incorporated herein by reference, wherein said adding of said tag comprises adding said tag between a header checker and a payload random byte and trail byte payload.

12. The method according to claim 8, all the limitations of which are incorporated herein by reference, wherein said adding of said tag comprises adding a tag comprising a plurality of headers, wherein each of said headers differ from one another, and wherein said headers comprise an elongated bit stream.

13. A computer program product comprising a computer usable medium having a computer readable program, wherein the computer readable program, when executed on a computer, causes the computer to perform a method, comprising:
receiving a signal;
performing entropy average coding to produce an entropy coded bit stream, wherein said performing of said entropy average coding comprises encoding said signal and adjusting entropy of said signal to make said entropy consistent throughout said signal;
adding a tag to said entropy coded bit stream;
reading said tag when processing said entropy coded bit stream; and
avoiding subsequent entropy averaging on said entropy coded bit stream when said tag is present.

14. The computer program product according to claim 13, all the limitations of which are incorporated herein by reference, wherein said avoiding of said subsequent entropy averaging comprises avoiding unnecessary coding and entropy averaging of said entropy coded bit stream.

15. The computer program product according to claim 13, all the limitations of which are incorporated herein by reference, wherein said performing of said entropy average coding to produce said entropy coded bit stream comprises producing a condensed signal by removing redundant entropy.

16. The computer program product according to claim 13, all the limitations of which are incorporated herein by reference, wherein said adding of said tag comprises adding said tag in a beginning portion of said entropy coded bit stream.

17. The computer program product according to claim 13, all the limitations of which are incorporated herein by reference, wherein said adding of said tag comprises adding said tag between a header checker and a payload random byte and trail byte payload.

18. The computer program product according to claim 13, all the limitations of which are incorporated herein by reference, wherein said adding of said tag comprises adding a tag comprising a plurality of headers, wherein each of said headers differ from one another, and wherein said headers comprise an elongated bit stream.

* * * * *